United States Patent [19]

Phillips

[11] 4,345,836

[45] Aug. 24, 1982

[54] TWO-STAGE WAFER PREALIGNMENT SYSTEM FOR AN OPTICAL ALIGNMENT AND EXPOSURE MACHINE

[75] Inventor: Edward H. Phillips, Mountain View, Calif.

[73] Assignee: Optimetrix Corporation, Mountain View, Calif.

[21] Appl. No.: 87,220

[22] Filed: Oct. 22, 1979

[51] Int. Cl.³ .............................................. G03B 27/42
[52] U.S. Cl. ........................................ 355/53; 355/77; 355/78
[58] Field of Search ....................... 355/53, 54, 63, 45, 355/64, 65, 78; 414/331, 416, 332, 305, 774 B, 779

[56] References Cited

U.S. PATENT DOCUMENTS

| | | | |
|---|---|---|---|
| 3,709,378 | 1/1973 | Segal | 214/1 |
| 3,865,254 | 2/1975 | Johannsmeier | 355/78 |
| 3,902,615 | 9/1975 | Levy et al. | 414/331 X |
| 3,984,186 | 10/1976 | Momose et al. | 355/45 |
| 4,140,392 | 2/1979 | Lacombat et al. | 355/53 X |

FOREIGN PATENT DOCUMENTS 2854824 6/1979 Fed. Rep. of Germany .
2389928 12/1978 France .

*Primary Examiner*—Richard A. Wintercorn
*Attorney, Agent, or Firm*—Roland I. Griffin; Harry E. Aine

[57] ABSTRACT

In an optical alignment and exposure machine, particularly suited for aligning semiconductive wafers with and exposing them to microelectronic circuit patterns, two stages of mechanical prealignment of the wafers are performed. In the first stage of mechanical prealignment a wafer is received at a prealignment station where the periphery of the wafer engages at least one of three belt-driven rollers in such a manner as to turn the wafer so as to align a flat side edge or alignment flat of the wafer with two of the three rollers. A transfer arm picks up the first-stage prealigned wafer and transfers it to a rotatable alignment and exposure chuck carried by an X-Y addressable work stage. In the second stage of mechanical prealignment two alignment members coupled to the rotatable chuck for rotation therewith index with the alignment flat of the wafer, and additional alignment members also coupled to the rotatable chuck for rotation therewith index either the center of the wafer or a rounded side edge of the wafer to a predetermined position. An optical alignment system permits rotation of the chuck to more precisely align images of alignment marks on the wafer with alignment marks on the mask. Following such precision alignment of the first wafer, the second stage of mechanical prealignment of each succeeding wafer is performed at the final angular position of the chuck during the preceding precision alignment performed with the optical alignment system. Apparatus is coupled to the chuck for selectively moving a wafer supported on the chuck into engagement with a stop to accurately position the plane of an emulsion on the wafer with respect to a focal plane of the optical alignment system.

22 Claims, 6 Drawing Figures

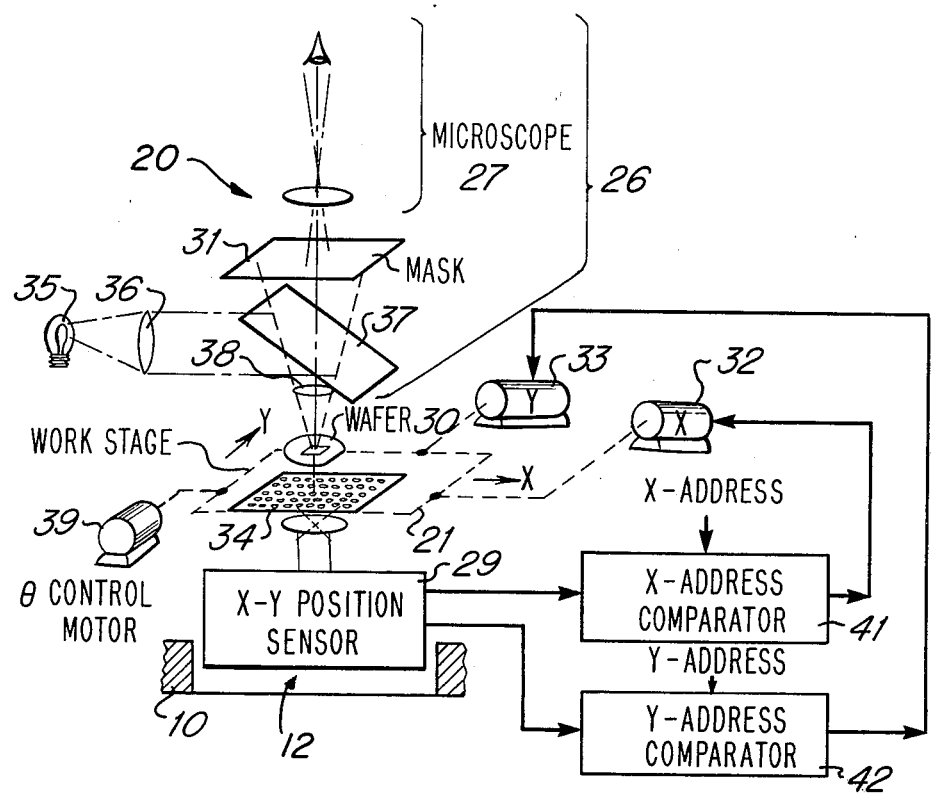
Figure 1
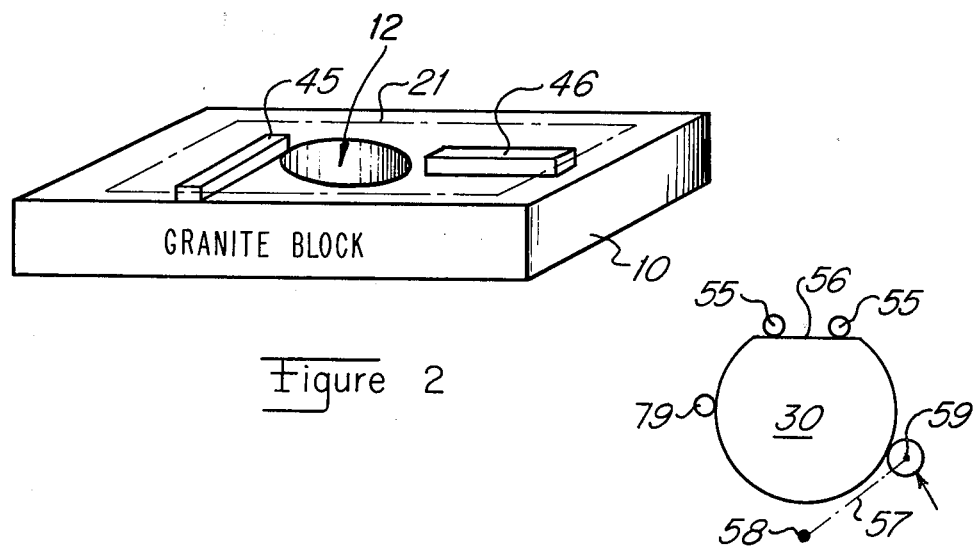
Figure 2
Figure 6

TWO-STAGE WAFER PREALIGNMENT SYSTEM FOR AN OPTICAL ALIGNMENT AND EXPOSURE MACHINE

BACKGROUND OF THE INVENTION

The present invention relates in general to optical alignment and exposure machines particularly suited for aligning an image of a semiconductive wafer with respect to a mask and for exposing the wafer in accordance with the mask, and more particularly to an improved two-stage prealignment system for mechanically prealigning the wafer with a reference position determined by precision optical alignment of the preceding wafer.

DESCRIPTION OF THE PRIOR ART

Heretofore optical alignment and exposure machines have employed two stages of mechanical wafer prealignment. In one such prior art machine, a wafer to be exposed is advanced from a cassette to a first mechanical prealignment stage including three belt-driven rollers. At least one of these rollers frictionally engages the edge of the wafer so as to turn the wafer until a flat side edge or alignment flat of the wafer indexes with two of the rollers, at which time the wafer stops turning and is automatically mechanically prealigned with the rollers.

The prealigned wafer is transferred from the first prealignment stage to a receiving station in the first prealigned condition. The receiving station includes a pair of drive belts which pick up the prealigned wafer and trundle it onto an alignment and exposure chuck. The alignment and exposure chuck includes a rotatable chuck member surrounded by a non-rotatable second mechanical prealignment stage.

The second prealignment stage includes a pair of spaced alignment members for engaging and indexing the alignment flat of the wafer and a pair of pivotable arms which engage opposite rounded side edges of the wafer for aligning the center of the wafer to a predetermined position on the rotatable chuck member. Thereafter, the rotatable chuck member and the wafer are rotated relative to the second prealignment stage for precision optical alignment of images of alignment marks on the wafer with alignment marks of a pattern to be projected from a mask onto the wafer. A chuck rotation monitoring system keeps track of the amount of rotation required for the optical alignment. After exposure of the wafer to the projected pattern of the mask, the chuck rotation monitoring system rotates the rotatable chuck member back to its original angular position relative to the second prealignment stage. A transfer arm thereupon transfers the exposed wafer to an output station. The next first-stage prealigned wafer is then transferred to the receiving station and thence onto the alignment and exposure chuck where the second stage of prealignment is performed as before. The rotatable chuck member is then rotated by the rotation monitoring system back to the position determined by the preceding optical alignment prior to exposure of that wafer.

An optical alignment and exposure machine such as that described above was manufactured and publicly demonstrated by Kasper Instruments, Inc. of Mountain View, Calif. in 1977. One of the problems with this prior machine was that the first stage of prealignment of the wafer was seriously degraded in the trundelling operation used for moving the wafer from the receiving station to the alignment and exposure chuck. Often the first stage of prealignment of the wafer was so seriously degraded in this trundelling operation as to prevent proper capture of the wafer by the second prealignment stage. Another difficulty with the prior machine was the complexity introduced by the chuck rotation monitoring system employed for monitoring the rotation of the rotatable chuck member during precision optical alignment and the loss of time encountered in returning the chuck member to its original angular position relative to the second prealignment stage.

SUMMARY OF THE PRESENT INVENTION

The principal object of the present invention is the provision of an improved two-stage mechanical wafer prealignment system for an optical alignment and exposure machine.

In one feature of the present invention, a wafer is transferred from a prealignment stage, where a first stage of mechanical prealignment of the wafer is performed, directly to a rotatable alignment and exposure chuck while maintaining the first stage of prealignment of the wafer. Thus, the first stage of prealignment of the wafer is not lost in transferring the wafer from the prealignment stage to the alignment and exposure chuck, where a second stage of mechanical prealignment of the wafer is performed.

In another feature of the present invention, the mechanism for performing the second stage of mechanical prealignment of the wafer is coupled to and rotatable with the alignment and exposure chuck such that the second stage of mechanical prealignment prealigns the wafer on the chuck at the angular position to which the chuck was moved during precision optical alignment of the preceding wafer. Thus, more precise second-stage prealignment of the wafer is obtained without having to monitor the rotation of the chuck during precision optical alignment and without having to return the chuck to the angular position at which the wafer was transferred to the chuck from the prealignment stage.

In still another feature of the present invention, the alignment and exposure chuck is carried by a work stage translatable along X and Y axes and is selectively translatable along an orthogonal Z axes for positioning a major face of a prealigned wafer disposed on the chuck at a predetermined focal plane as determined by stops rotatable with the chuck.

Other features and advantages of the present invention will become apparent upon a perusal of the following specification taken in connection with the accompanying drawings.

BRIEF DESCRIPTION OF THE DRAWINGS

FIG. 1 is a schematic diagram, partly in block diagram form, of an optical alignment and exposure machine incorporating features of the present invention.

FIG. 2 is a schematic perspective view of a granite block portion of the machine of FIG. 1.

FIG. 6 is a schematic diagram depicting an alternative mechanism for performing the second stage of mechanical prealignment.

DESCRIPTION OF THE PREFERRED EMBODIMENTS

Figure 3:
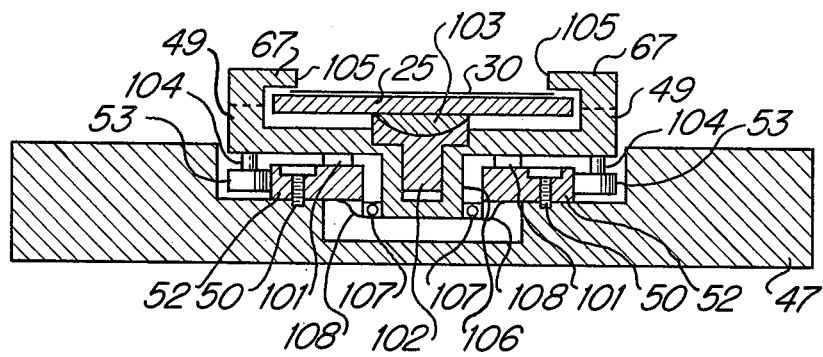
FIG. 3 is a longitudinal sectional view of a portion of a work stage and an alignment and exposure chuck of the machine of FIG. 1.
Figure 4:
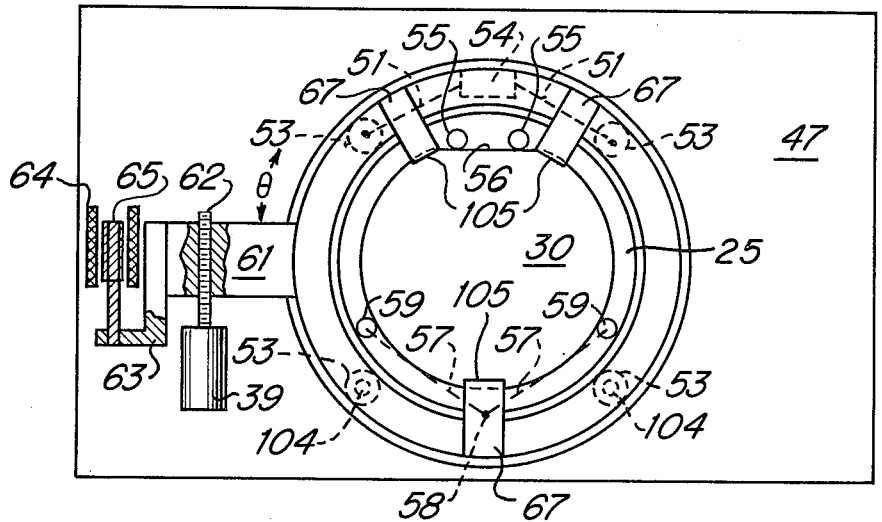
FIG. 4 is a plan view, partly cut away, of the work stage and the alignment and exposure chuck of FIG. 3.
Figure 5:
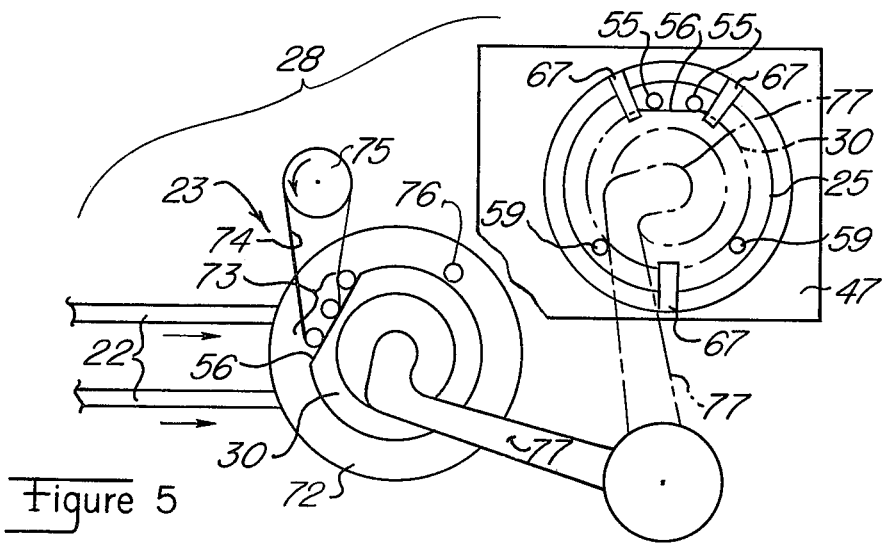
FIG. 5 is a plan view of a prealignment stage for performing a first stage of mechanical prealignment and of the alignment and exposure chuck and an associated mechanism for performing a second stage of mechanical prealignment, all forming part of the machine of FIG. 1.

Referring now to FIGS. 1-5, there is shown a step-and-repeat projection alignment and exposure machine 20 incorporating features of the present invention. This machine 20 includes a work stage 21 supported on a base unit (not shown) to receive a semiconductive wafer 30 and to precisely control horizontal positioning of the wafer 30 along X and Y axes. An optical unit 26 is supported from the base unit. As shown in FIG. 5, an automatic wafer transport unit 28 is included for transporting the wafer 30 to and from the work stage 21. The base unit includes a granite block 10 having an upper reference surface which is flat to within one micron across the surface thereof and having a cylindrical bore 12 extending vertically therethrough for containing an optical sensor stage 29 therewithin.

In operation, the operator introduces wafers 30 into the machine 20 via a conventional cassette (not shown), which loads the wafers 30 sequentially onto a pair of endless belts 22 (FIG. 5), which in turn transport the wafers 30 to a prealignment stage 23. Following a first stage of mechanical prealignment performed at the prealignment stage 23, each wafer 30 is sequentially transferred to an alignment and exposure chuck 25 of the work stage 21 where a second stage of mechanical prealignment is performed. The operator moves a microscope portion 27 of the optical unit 26 into position for viewing a major surface of a mask 31, with which an image of an addressed region of a major surface of the wafer 30 is to be precisely optically aligned prior to exposure of the wafer in accordance with an image of the pattern of the mask 31. The operator, by means of a programmer (not shown), selects the addressed region of the wafer to receive the exposure pattern projected from the mask 31. X and Y servo motors 32 and 33 are coupled to the work stage 21 for moving the work stage and an X-Y coordinate system of indicia 34 affixed to the work stage over the optical sensor stage 29, which is contained within the cylindrical bore 12 of the granite block 10 and which senses the X and Y coordinates of the work stage 21, to position the addressed region of the wafer 30 so that an image of that region may be viewed by the microscope portion 27 of the optical unit 26.

The operator views the image of the addressed region of the wafer 30, which region is illuminated by light projected from a source 35 via a lens 36 through a beam splitting mirror 37 and a lens 38. The image of the illuminated addressed region of the wafer 30 is projected back through lens 38 and beam splitting mirror 37 onto the back side of the mask 31 so as to superimpose the pattern of the mask and the image of the addressed region of the wafer 30. The superimposed pattern of the mask and image of the addressed region of the wafer are observed by the operator through the microscope 27 and mask 31 while controls are manipulated to adjust the position of the sensor stage 29 thereby causing a slight correction to be made in the position of the work stage 21 to precisely align the image of the addressed region of the wafer with the pattern of the mask (this produces an interpolated value for the X and Y coordinates of the addressed region of the wafer). The operator also energizes a $\theta$ control motor 39 carried on the work stage for adjusting the angular orientation of the alignment and exposure chuck 25 and, hence, of the wafer 30 about an axis perpendicular to the plane of the X and Y axes so as to angularly align the image of the addressed region of the wafer with the pattern of the mask.

The operator next moves the microscope 27 out of the way and moves a projection light source (not shown) of the optical unit 26 into position to expose the wafer in accordance with the image of the pattern of the mask through a projection lens. The next addressed region of the wafer 30 is then moved into position for optical alignment, if necessary, and exposure. This is done by the programmer which outputs the X and Y coordinates of this next addressed region of the wafer 30 to reference inputs of X and Y address comparators 41 and 42 for comparison with the X and Y coordinates sensed by the sensor stage 29 to generate error signals for each of the X and Y servo motors 32 and 33. These error signals cause the work stage 21 to move this next addressed region of the wafer 30 into the aforementioned position for optical alignment and exposure. The wafer is sequentially exposed by this step-and-repeat process until the wafer is totally exposed. When the wafer 30 has been totally exposed, the operator or programmer initiates operation of the wafer transport unit 28 which thereupon transfers the exposed wafer 30 to an output station and advances a new wafer from the prealignment stage 23 into position on the alignment and exposure chuck 25.

For a more detailed disclosure of the projection alignment and exposure machine 20 (other than the two-stage wafer prealignment system of the present invention), see copending U.S. patent application Ser. No. 925,454 filed July 17, 1978 and titled, "X-Y Addressable Workpiece Positioner Having an Improved X-Y Address Indicia Sensor" (continued as U.S. patent application Ser. No. 136,816 filed Apr. 2, 1981, which has in turn been continued as U.S. patent application Ser. No. 286,985 filed July 27, 1981); U.S. patent application Ser. No. 918,713 filed June 26, 1978 and titled, "X-Y Addressable Workpiece Positioner and Mask Aligner Using Same" (continued as U.S. patent application Ser. No. 198,364 filed Oct. 20, 1980); U.S. patent application Ser. No. 015,713 filed Feb. 27, 1979 and titled, "Interferometrically Controlled Stage with Precisely Orthogonal Axes of Motion" (continued as U.S. patent application Ser. No. 198,358 filed Oct. 20, 1980); U.S. patent application Ser. No. 026,722 filed Apr. 3, 1979 and titled, "Improved Step-and-Repeat Projection Alignment and Exposure System;" and U.S. patent application Ser. No. 025,917 filed Apr. 2, 1979 and titled, "Optical Focusing System" (continued as U.S. patent application Ser No. 183,402 filed Sept. 2, 1980). The aforecited copending U.S. patent applications are hereby incorporated by reference.

Referring now to FIGS. 2-5, the two-stage wafer prealignment system of the present invention will be described in greater detail. More particularly, the work stage 21 is supported on the granite block 10 via the intermediary of a pair of orthogonally directed rails 45 and 46 respectively defining the Y and X axes of the work stage. The work stage 21 includes a lower platform member (not shown) supported by air bearings on the flat upper surface of the granite block 10 for movement generally along the X axis of the work stage. An upper platform member 47 is supported by air bearings on the flat upper surface of the granite block 10 (through clearance openings in the lower platform member) for movement generally along the orthogonal Y axis of the work stage 21. In addition, the upper platform member 47 is coupled to the lower platform member for movement therewith generally along the X-axis of the work stage 21. Thus, the upper platform member 47 of the work stage 21 may be moved in a horizontal X-Y plane generally along the orthogonal X and Y axes of the work stage and, since such movement may occur simultaneously, the upper platform member may be moved along any line in the horizontal X-Y plane.

The semiconductive wafer 30 is held by vacuum to the upper surface of alignment and exposure chuck 25, which comprises a disc-shaped vacuum chuck carried by the upper platform member 47 of the work stage 21. The mount for the vacuum chuck 25 includes a ring-shaped plate 52 secured to the upper surface of the upper platform member 47 by means of a plurality of screws 50. A circular support plate 49 is rotatably mounted for rotation around the ring-shaped plate 52 via a plurality of dependent roller bearings 53 which roll on the outer peripheral edge of the ring-shaped plate 52. The roller bearings 53 are disposed at approximately ninety degree intervals around the periphery of the ring-shaped plate 52. Two of the roller bearings 53 are fixedly mounted to the circular support plate 49 by axle pins 104 (FIGS. 3 and 4), and two others are mounted on leaf springs 51 which in turn are captured between the support plate and a block 54 held to the support plate by screws (not shown). The leaf springs force all the roller bearings 53 into firm rolling contact with the outer peripheral edge of the ring-shaped plate 52.

A needle bearing thrust washer 101 is interposed between the lower surface of the support plate 49 and the upper surface of the ring-shaped plate 52. The support plate 49 includes a dependent hollow hub portion 106 projecting through the central opening in the ring-shaped plate 52. A ball bearing assembly 107 is affixed to the hub portion 106 of the support plate 49 as is a spider spring 108 that bears at its outer ends against the lower surface of the ring-shaped plate 52 to provide a thrust load on the needle bearing thrust washer 101.

A piston 102 is centrally disposed within the hollow hub portion 106 of the support plate 49 and is provided with an enlarged upper end portion having a concave spherical bearing surface formed therein for bearing engagement with an outer convex spherical surface of a ball bearing segment 103 affixed to the lower side of the vacuum chuck 25. The center of curvature for the ball bearing segment 103 is at the center of the upper surface of the wafer 30 so that the vacuum chuck 25 is free to tilt about the center of the wafer without shifting the wafer in the X and Y directions.

A castellated reference ring 67 is affixed by screws (not shown) to the upper surface of the support plate 49. The reference ring 67 includes a plurality of reference fingers or tabs 105 that extend inwardly a short distance over the lip of a wafer 30 disposed on the vacuum chuck 25. The lower surfaces of the reference fingers 105 define a reference plane that corresponds to the focal plane of the optical projection system employed for projecting an image of the mask onto a photosensitive emulsion on the upper surface of the wafer 30. As indicated in FIG. 5, the reference fingers 105 are located around the periphery of the vacuum chuck 25 so as to permit a vacuum pick-up portion of a transfer arm 77 of the wafer transport unit 28 to traverse an arcuate path to and from the vacuum chuck 25 with a picked-up wafer and without interference with the reference fingers 105. During transit of the transfer arm 77 with a wafer 30, the vacuum chuck 25 supported by the piston 102 is fully retracted to provide clearance for the wafer under the inwardly protruding ends of the reference fingers 105.

After the wafer 30 has been deposited and prealigned upon the retracted vacuum chuck 25, a vacuum is drawn to pull the wafer 30 against the upper surface of the vacuum chuck 25, and positive air pressure is applied to the lower end of the piston 102 to move the piston 102 in a direction orthogonal to the X-Y plane (i.e., along the Z axis) to urge the peripheral portion of the wafer 30 into contacting engagement with the inner ends of the reference fingers 105 and thereby accurately position the plane of the emulsion on the upper surface of the wafer 30 at the focal plane of the optical projection system.

Referring now to FIGS. 3 and 4, the support plate 49 includes a pair of upstanding roller bearing pins 55, which extend through openings in the vacuum chuck 25 to register with a flat side edge or alignment flat 56 of the wafer 30 positioned on the top surface of the vacuum chuck 25. A pair of arms 57 pivotable in the X-Y plane are affixed to the support plate 49 at pivot points 58, where the arms 57 are geared together so as to move at equal rates along arcuate paths toward each other about the pivot points 58. The outer ends of the arms 57 include upstanding roller bearings 59 pivotably secured to the ends of the respective arms 57. These roller bearings 59 extend through elongated slots in the upper surface of the vacuum chuck 25 for bearing against opposite rounded side edges of the wafer 30.

A radially-directed arm 61 is affixed to the support plate 49 for adjusting the angular position of the vacuum chuck 25 in the $\theta$ direction about an axis perpendicular to the X-Y plane. The $\theta$ control motor 39 is affixed to the upper platform member 47 of the work stage 21 and serves to rotate the vacuum chuck 25 via a drive screw 62 mating with a pivotable threaded member coupled to the arm 61. An L-shaped bracket 63 is affixed to the outer end of the arm 61, and a linear variable differential transformer (L.V.D.T.) 64, which is affixed to the upper platform member 47 of the work stage 21, has its input differential magnetic coupling bar 65 coupled to the bracket 63 for sensing the angular position of the vacuum chuck 25.

Referring now to FIG. 5, the first and second stages of mechanical prealignment of a wafer 30 will be described in greater detail. More particularly, the wafer 30 is trundled to the prealignment stage 23 via the pair of endless belts 22. The wafer 30 is received at the prealignment stage 23 upon a plate 72 including an air bearing in the surface thereof to facilitate sliding movement of the wafer 30 on the plate 72. The plate 72 is then tilted so as to cause the wafer 30 to slide by gravity toward three rollers 73 driven by a drive belt 74 in turn driven from a pulley 75. This type of prealignment stage forms the subject matter of and is fully disclosed in U.S. Pat. No. 3,865,254 issued Feb. 11, 1975 and titled, "Prealignment System for an Optical Alignment and Exposure Instrument."

Briefly, the rollers 73 and the drive belt 74 are so arranged relative to a reference pin 76 as to turn the wafer 30 until the alignment flat 56 of the wafer is aligned with two of the drive rollers 73, whereupon the rotation of the wafer stops and the plate 72 tilts back to the horizontal position. The prealigned wafer 30 is then picked up by means of the transfer arm 77 and transferred, as prealigned by the prealignment stage 23, to the vacuum chuck 25.

The prealignment of the wafer 30 obtained at the prealignment stage 23 is sufficiently precise that, when the pivotable arms 57 are moved toward each other, the roller bearings 59 ride on opposite rounded side edges of the wafer 30 and push the alignment flat 56 of the wafer into indexing relation with the roller bearing pins 55. The action of the roller bearings 59 is such as to index the center of the wafer 30 at a precisely predetermined centered position on the vacuum chuck 25.

At the first level of photomasking (i.e., when the photosensitive emulsion on the upper surface of the wafer 30 has not been previously exposed and developed), the alignment and exposure machine 20 sequentially advances the work stage 21 and, hence, the wafer 30 to predetermined addressed locations for sequentially exposing the emulsion on the upper surface of the wafer to a predetermined number of exposures of an image of the pattern of the mask 31. In a typical example, the emulsion is exposed to the image of the pattern of the mask 31 sixty-four times at sixty-four predetermined addressed locations of the wafer 30. After the last of these exposures, the work stage 21 is returned to the addressed location at which the wafer 30 was initially transferred thereto by the transfer arm 77, and a similar transfer arm (not shown) thereupon transfers the exposed wafer 30 from the vacuum chuck 25 to an output station similar to the plate 72 of the prealignment stage 23. This output station includes a pair of transfer belts for transferring the wafer 30 into an output cassette. Meanwhile, the transfer arm 77 returns to the prealignment stage 23, picks up another prealigned wafer 30, and transfers it to the vacuum chuck 25.

For the second and subsequent levels of photomasking, alignment marks printed onto the wafer 30 at the first level are employed for aligning an image of the wafer with complimentary marks on the masks 31 of the second and subsequent levels of photomasking. Thus, as previously described, the operator views images of the alignment marks and actuates the θ control motor 39 for accurately angularly positioning the image of the wafer 30 relative to the mask 31.

Once the initial X, Y and θ optical alignments of the wafer 30 have been accomplished, the machine 20 may be operated in either of two different alignment modes. In a first alignment mode, the work stage 21 is sequentially moved to the predetermined addressed locations to permit sequential exposure of the wafer 30 at those predetermined addressed locations without any further correction of the alignment of the wafer. In a second alignment mode, the X, Y and θ alignments of the wafer 30 may be corrected at each predetermined addressed location or at selected ones of those predetermined addressed locations. In any event, after the wafer 30 has been completely exposed, the angular alignment of the vacuum chuck 25 is maintained for subsequent transfers of prealigned wafers from the prealignment stage 23 to the vacuum chuck 25. This is to be contrasted with the prior art wherein the mechanism for performing the second stage of mechanical prealignment of the wafer was not coupled to the alignment and exposure or vacuum chuck 25 for rotation therewith so that an angular monitoring system had to be used to return the alignment and exposure chuck to its initial reference angular position for receiving a prealigned wafer and then to rotate the alignment and exposure chuck back to the position at which the preceding wafer was optically aligned.

Referring now to FIG. 6, there is shown an alternative mechanism for performing the second stage of mechanical prealignment of a wafer 30. This mechanism is similar to that previously described with regard to FIGS. 3, 4, and 5 with the exception that one of the pivotable arms 57 is replaced by a fixed indexing roller 79 for engaging a rounded side edge of the wafer. The remaining pivotable arm 57 pivots toward the fixed indexing roller 79 so that the pivotable roller bearing 59 forces the wafer 30 against the fixed indexing roller 79 and forces the alignment flat 56 of the wafer against the roller bearing pins 55 to prealign the alignment flat and a rounded side edge of the wafer. Thus, the mechanism of FIG. 6 indexes a rounded side edge of the wafer 30 in contrast with indexing the center of the wafer as when both pivotable arms 57 are employed. Either of the opposite rounded side edges of the wafer 30 may be indexed by exchanging the positions of the pivotable arm 57 and the fixed indexing roller 79 to opposite sides of the wafer.

The advantages of using the mechanical two-stage wafer prealignment system of the present invention, when contrasted with the prior art, include a more precise prealignment, thereby facilitating either automatic or manual optical alignment with consequent reduction in alignment time for a more precise alignment. More particularly, the optical alignment time has been reduced from approximately twenty seconds to five seconds with this mechanical two-stage prealignment system. The second stage of mechanical prealignment is obtained to 0.0005 inch consistently without returning the chuck to its initial reference angular position.

I claim:

1. In a method for prealignment of a wafer, having an alignment flat formed at the periphery thereof, in an optical alignment and exposure machine, the steps of:
   receiving the wafer at a prealignment station;
   turning the wafer about an axis generally perpendicular to a plane of one of its major faces to bring the alignment flat of the wafer into alignment with a first reference operatively associated with the prealignment station to derive a first stage of prealignment of the wafer;
   transferring the first-stage prealigned wafer directly to a rotatable alignment and exposure chuck while maintaining the first stage of prealignment of the wafer; and
   aligning the alignment flat of the wafer with a second reference operatively associated with said chuck to derive a second stage of more precise prealignment of the wafer.

2. The method of claim 1 including the step of rotating said chuck with the prealigned wafer thereon to an angular position for optically aligning alignment marks on the wafer with respect to alignment marks on a mask with an optical projection system and for permitting exposure of a photosensitive emulsion on the wafer in accordance with a pattern of the mask.

3. The method of claim 1 including the steps of:
   translating said chuck with the prealigned wafer thereon to successive predetermined spaced locations generally in a plane parallel to a major face of the wafer; and successively exposing spaced regions of a photosensitive emulsion on a major face of the wafer in accordance with a mask pattern projected onto each different one of those spaced regions of the photosensitive emulsion at a respective different one of said predetermined spaced locations.

4. The method of claim 1 wherein the step of aligning the alignment flat of the wafer with the second reference operatively associated with said chuck to derive the second stage of more precise prealignment of the wafer includes the steps of:

urging the alignment flat of the wafer against a pair of spaced first alignment members coupled to said chuck for rotation therewith; and indexing the wafer with second alignment members coupled to said chuck for rotation therewith.

5. The method of claim 4 wherein said second alignment members include a pair of spaced moveable second alignment members for moving toward each other at equal rates to press against opposite rounded edges of the wafer and index the center of the wafer to a predetermined location between the pair of moveable second alignment members.

6. The method of claim 4 wherein said second alignment members include:

an indexing member fixed in a predetermined position relative to said chuck to index with a rounded edge of the wafer; and a moveable member positioned for moving toward said fixed indexing member to press against an opposite rounded edge of the wafer and index the first-mentioned rounded edge of the wafer with said fixed indexing member.

7. The method of claim 2 including the steps of:

transferring the wafer from said chuck following exposure of the photosensitive emulsion on the wafer; and transferring a second first-stage prealigned wafer onto said chuck while maintaining the angular position of said chuck as determined for optical alignment of the first wafer; and aligning the alignment flat of the second wafer with said second reference operatively associated with said chuck at said angular position to derive the second stage of more precise prealignment of the second wafer.

8. The method of claim 1 including the steps of:

translating said chuck with the prealigned wafer thereon in a direction orthogonal to one of the major faces of the wafer into a predetermined plane relative to a focal plane of an optical projection system and relative to a parallel reference plane; and exposing a photosensitive emulsion on a major face of the wafer to a mask pattern projected onto that major face of the wafer.

9. In an apparatus for prealignment of a wafer, having an alignment flat formed at the periphery thereof, in an optical alignment and exposure machine;

first prealignment means for receiving a wafer and for turning the wafer about an axis generally perpendicular to a plane of one of its major faces to bring the alignment flat of the wafer into alignment with a first reference operatively associated with said first prealignment means to derive a first stage of prealignment of the wafer;

alignment and exposure chuck means for use in optically aligning the wafer and subsequently exposing a photosensitive emulsion on a major face of the aligned wafer, said alignment and exposure chuck means including second prealignment means for aligning the alignment flat of the wafer with a second reference operatively associated with said chuck means and rotatable therewith to derive a second stage of more precise prealignment of the wafer; and transfer means for transferring the first-stage prealigned wafer directly to said alignment and exposure chuck means while maintaining the first stage of prealignment of the wafer.

10. The apparatus of claim 9 including means for rotating said alignment and exposure chuck means with the prealigned wafer thereon to optically align alignment marks on the wafer with respect to alignment marks on a mask with an optical projection system and to permit exposure of the photosensitive emulsion on the wafer in accordance with a pattern of the mask.

11. The apparatus of claim 9 including:

means for translating said alignment and exposure chuck means with the prealigned wafer thereon to successive predetermined spaced locations generally in a plane parallel to a major face of the wafer; and means for successively exposing spaced regions of the photosensitive emulsion on the wafer in accordance with a mask pattern projected onto each different one of those spaced regions of the photosensitive emulsion at a respective different one of said predetermined spaced locations.

12. The apparatus of claim 9 wherein said second prealignment means includes;

a pair of spaced first alignment means coupled to said alignment and exposure chuck means for rotation therewith, said pair of spaced first alignment means being disposed for indexing with the alignment flat of the wafer; and second alignment means coupled to said alignment and exposure chuck means for rotation therewith, said second alignment means being disposed for urging the alignment flat of the wafer against said pair of spaced first alignment means and for indexing the wafer on said alignment and exposure chuck means.

13. The apparatus of claim 12 wherein said second alignment means includes a pair of spaced alignment members for moving toward each other at equal rates to press against opposite rounded edges of the wafer and index the center of the wafer to a predetermined location between said pair of spaced alignment members.

14. The apparatus of claim 12 wherein said second alignment means includes:

an indexing means fixed in a predetermined position relative to said alignment and exposure chuck means for indexing with a rounded edge of the wafer; and moveable means positioned for moving toward said fixed indexing means to press against an opposite rounded edge of the wafer and index the first-mentioned rounded edge of the wafer with said fixed indexing means.

15. The apparatus of claim 10 wherein:

said apparatus includes means for transferring the wafer from said alignment and exposure chuck means following exposure of the photosensitive emulsion on the wafer;

said first-mentioned transfer means is operable for transferring a second first-stage prealigned wafer onto said alignment and exposure chuck means while maintaining the final angular position of said chuck means as determined during optical alignment of the preceding wafer; and said second prealignment means aligns the flat on said second wafer with said second reference operatively associated with said alignment and exposure chuck means while said chuck means is at said final angular position to derive the second stage of more precise prealignment.

16. The apparatus of claim 9 including:

work stage means for translating said alignment and exposure chuck means in a plane parallel to a major face of the wafer;

means for translating said alignment and exposure chuck means with the prealigned wafer thereon in a direction orthogonal to one of the major faces of the wafer into a predetermined plane relative to a focal plane of an optical projection system and relative to a reference plane; and means for exposing the photosensitive emulsion on the wafer to a mask pattern projected onto the wafer.

17. Alignment apparatus for sequentially aligning workpieces with respect to a masking element prior to exposing a photosensitive film on each aligned workpiece in accordance with the masking element, said alignment apparatus comprising:

first prealignment means for receiving a workpiece and prealigning the workpiece with respect to a first reference;

chuck means for rotating a prealigned workpiece to facilitate optical alignment of the prealigned workpiece with respect to the masking element;

transfer means for transferring the prealigned workpiece from the first prealignment means onto the chuck means; and second prealignment means coupled to the chuck means for rotation therewith and for further prealigning the transferred prealigned workpiece with respect to a second reference while the transferred prealigned workpiece is on the chuck means and while the chuck means is at the angular position of optical alignment of a preceding workpiece.

18. Alignment apparatus as in claim 17 wherein said first prealignment means rotates the received workpiece to prealign a reference portion of a peripheral edge of the received workpiece with respect to the first reference.

19. Alignment apparatus as in claim 18 wherein said second prealignment means includes:

first indexing means coupled to said chuck means for rotation therewith and for indexing with the reference portion of the peripheral edge of the transferred prealigned workpiece; and second indexing means coupled to said chuck means for rotation therewith and for urging the reference portion of the peripheral edge of the transferred prealigned workpiece against said first indexing means.

20. Alignment apparatus as in claim 19 wherein said second indexing means includes a pair of spaced alignment members for moving toward each other and into contact with opposite sides of the peripheral edge of the transferred prealigned workpiece to locate the transferred prealigned workpiece at a predetermined location centered between those alignment members while at the same time urging the reference portion of the peripheral edge of the transferred prealigned workpiece against said first indexing means.

21. Alignment apparatus as in claim 19 wherein said second indexing means includes:

a fixed alignment member coupled to said chuck means for rotation therewith and for indexing with one side of the peripheral edge of the transferred prealigned workpiece; and a spaced movable alignment member coupled to said chuck means for rotation therewith and for moving toward the fixed alignment member and into contact with the opposite side of the peripheral edge of the transferred prealigned workpiece to urge said one side of the peripheral edge of the transferred prealigned workpiece against the fixed alignment member while at the same time urging the reference portion of the peripheral edge of the transferred prealignment workpiece against said first indexing means.

22. Alignment apparatus as in claim 20 or 21 wherein said first indexing means comprises a pair of spaced alignment members coupled to said chuck means for rotation therewith and for indexing with the reference portion of the peripheral edge of the transferred prealigned workpiece.

* * * * *